(12) United States Patent
Hilton et al.

(10) Patent No.: US 8,638,085 B2
(45) Date of Patent: Jan. 28, 2014

(54) APPARATUS AND METHODS FOR MAPPING A WIRED NETWORK

(75) Inventors: Paul C. M. Hilton, Millis, MA (US); Kevin M. Johnson, Natick, MA (US)

(73) Assignee: Outsmart Power Systems, LLC, Natick, MA (US)

( * ) Notice: Subject to any disclaimer, the term of this patent is extended or adjusted under 35 U.S.C. 154(b) by 0 days.

(21) Appl. No.: 13/041,231

(22) Filed: Mar. 4, 2011

(65) Prior Publication Data

US 2011/0210717 A1 Sep. 1, 2011

Related U.S. Application Data

(63) Continuation of application No. PCT/US2009/056268, filed on Sep. 8, 2009.

(60) Provisional application No. 61/094,675, filed on Sep. 5, 2008.

(51) Int. Cl.
*G01R 19/00* (2006.01)

(52) U.S. Cl.
USPC .............................................. 324/66; 324/67

(58) Field of Classification Search
None
See application file for complete search history.

(56) References Cited

U.S. PATENT DOCUMENTS

| | | | |
|---|---|---|---|
| 3,739,226 A | 6/1973 | Seiter et al. | |
| 4,002,951 A | 1/1977 | Halbeck | |
| 4,059,843 A | 11/1977 | Girismen | |
| 4,121,152 A * | 10/1978 | Hale et al. | 324/66 |
| 4,491,785 A * | 1/1985 | Pecukonis | 324/67 |
| 4,636,914 A | 1/1987 | Belli | |
| 4,755,913 A | 7/1988 | Sleveland | |
| 4,871,924 A | 10/1989 | Sellati | |
| 5,029,037 A | 7/1991 | Bartelink | |
| 5,153,816 A | 10/1992 | Griffin | |
| 5,365,154 A | 11/1994 | Schneider et al. | |

(Continued)

FOREIGN PATENT DOCUMENTS

| | | |
|---|---|---|
| JP | 2003259569 | 9/2003 |
| JP | 2004064136 | 2/2004 |

(Continued)

OTHER PUBLICATIONS

U.S. Office Action dated Jul. 5, 2011 issued in related U.S. Appl. No. 12/447,131.

(Continued)

*Primary Examiner* — Minh N Tang
(74) *Attorney, Agent, or Firm* — Grossman, Tucker, Perreault & Pfleger, PLLC

(57) ABSTRACT

The present disclosure relates to a system and method for determining the electrical connections of a plurality of nodes. The nodes may include an electrical power distribution system including a plurality of nodes, connected to the power distribution system. At least two of the nodes include node electronics, at least one of the nodes is configured to be operatively coupled to an external power drawing load, and at least one of the nodes upstream from the node configured to be operatively coupled to the external power drawing load is configured to detect power drawn by the external power drawing load. The at least one upstream node is configured to send a node electrical signals using the node electronics indicating that the drawn power was detected. The system is configured to identify the wiring configuration of the plurality of nodes relative to each other based on the node electrical signal.

13 Claims, 14 Drawing Sheets

(56) References Cited

U.S. PATENT DOCUMENTS

| | | |
|---|---|---|
| 5,424,894 A | 6/1995 | Briscall et al. |
| 5,485,356 A | 1/1996 | Nguyen |
| 5,568,399 A | 10/1996 | Sumic |
| 5,660,459 A | 8/1997 | Appelberg |
| 5,670,776 A | 9/1997 | Rothbaum |
| 5,684,469 A | 11/1997 | Toms |
| 5,833,350 A | 11/1998 | Moreland |
| 5,838,226 A | 11/1998 | Houggy et al. |
| 6,021,034 A | 2/2000 | Chan et al. |
| 6,055,435 A | 4/2000 | Smith et al. |
| 6,087,588 A | 7/2000 | Soules |
| 6,396,391 B1 | 5/2002 | Binder |
| 6,423,900 B1 | 7/2002 | Soules |
| 6,518,724 B2 | 2/2003 | Janik |
| 6,805,469 B1 | 10/2004 | Barton |
| 6,853,939 B2 | 2/2005 | Coffeen |
| 6,864,798 B2 | 3/2005 | Janik |
| 6,867,558 B2 | 3/2005 | Gaus, Jr. et al. |
| 6,993,289 B2 | 1/2006 | Janik |
| 7,057,401 B2 * | 6/2006 | Blades ......................... 324/713 |
| 7,082,541 B2 | 7/2006 | Hammond et al. |
| 7,209,839 B2 | 4/2007 | Roytelman |
| 7,253,732 B2 | 8/2007 | Osann |
| 7,276,915 B1 | 10/2007 | Euler et al. |
| 7,403,598 B2 | 7/2008 | Tyroler et al. |
| 7,483,524 B2 | 1/2009 | Binder |
| 7,549,785 B2 | 6/2009 | Faunce |
| 7,688,841 B2 | 3/2010 | Binder |
| 7,690,949 B2 | 4/2010 | Binder |
| 7,821,160 B1 | 10/2010 | Roosli et al. |
| 7,867,035 B2 | 1/2011 | Binder |
| 7,930,118 B2 | 4/2011 | Vinden et al. |
| 2002/0086567 A1 | 7/2002 | Cash |
| 2004/0015340 A1 | 1/2004 | Kadoi et al. |
| 2004/0131104 A1 | 7/2004 | Seferian |
| 2004/0142601 A1 | 7/2004 | Luu |
| 2004/0243377 A1 | 12/2004 | Roytelman |
| 2005/0184867 A1 | 8/2005 | Osann |
| 2005/0201190 A1 | 9/2005 | Kowalski |
| 2005/0275979 A1 | 12/2005 | Xu |
| 2006/0038672 A1 | 2/2006 | Schoettle |
| 2006/0072271 A1 | 4/2006 | Jones et al. |
| 2006/0072302 A1 | 4/2006 | Chien |
| 2006/0077614 A1 | 4/2006 | Bruccoleri et al. |
| 2006/0267788 A1 | 11/2006 | Delany |
| 2007/0024264 A1 | 2/2007 | Lestician |
| 2007/0120978 A1 | 5/2007 | Jones et al. |
| 2007/0227867 A1 | 10/2007 | Yang |
| 2007/0228183 A1 | 10/2007 | Kennedy et al. |
| 2008/0012681 A1 | 1/2008 | Kadar et al. |
| 2008/0024605 A1 | 1/2008 | Osann |
| 2009/0009353 A1 | 1/2009 | Schoettle |
| 2009/0058193 A1 | 3/2009 | Reid et al. |
| 2009/0073641 A1 | 3/2009 | Ross |
| 2009/0322159 A1 | 12/2009 | Dubose et al. |
| 2010/0084482 A1 | 4/2010 | Kennedy et al. |
| 2011/0260709 A1 | 10/2011 | Johnson et al. |

FOREIGN PATENT DOCUMENTS

| | | |
|---|---|---|
| WO | 2005039016 | 4/2005 |
| WO | 200805225 | 5/2008 |
| WO | 2008052223 | 5/2008 |

OTHER PUBLICATIONS

Extended European Search Report dated Dec. 2, 2011 issued in related Patent Application No. 07863633.9-1232.

Extended European Search Report dated Nov. 24, 2011 issued in related Patent Application No. 07863631.3-1232.

U.S. Office Action dated Jan. 23, 2012 issued in related U.S. Appl. No. 12/447,138.

U.S. Office Action dated Jan. 12, 2012 issued in related U.S. Appl. No. 12/447,131.

International Search Report and Written Opinion dated May 5, 2008 issued in related International Patent Application No. PCT/US07/82909.

International Search Report and Written Opinion dated Apr. 30, 2008 issued in related International Patent Application No. PCT/US07/82912.

International Search Report and Written Opinion dated Jul. 6, 2009 issued in related International Patent Application No. PCT/US2009/043390.

International Preliminary Report on Patentability dated Sep. 15, 2009 issued in related International Patent Application No. PCT/US2009/051581.

International Search Report and Written Opinion dated Sep. 15, 2009 issued in related International Patent Application No. PCT/US2009/051581.

International Search Report and Written Opinion dated Feb. 23, 2010 issued in related International Patent Application No. PCT/US2009/056268.

Whitlock, "Understanding, Finding, and Eliminating Ground Loops," Class Manual Course Codes A14T and B50T, CEDIA Expo 2003.

U.S. Office Action dated Dec. 13, 2010 issued in related U.S. Appl. No. 12/447,131.

U.S. Office Action dated Jul. 23, 2012 issued in related U.S. Appl. No. 12/447,131.

Japanese Office Action dated Sep. 4, 2012 issued in related Japanese Patent Application No. 2009-534929.

Japanese Office Action dated Oct. 9, 2012 issued in related Japanese Patent Application No. 2009-534928.

U.S. Office Action dated Oct. 5, 2012 issued in related U.S. Appl. No. 12/941,775.

U.S. Office Action dated Nov. 7, 2012 issued in related U.S. Appl. No. 12/447,138.

U.S. Notice of Allowance dated Jun. 27, 2013 issued in related U.S. Appl. No. 12/941,775.

* cited by examiner

APPARATUS AND METHODS FOR MAPPING A WIRED NETWORK

CROSS-REFERENCE TO RELATED APPLICATIONS

This application is a continuation of International Application Number PCT/US09/56268 filed Sep. 8, 2009, which claims benefit of U.S. Provisional Application No. 61/094,675 filed on Sep. 5, 2008, the teachings of which are incorporated herein by reference.

FIELD OF THE INVENTION

The present disclosure relates to a system and method for mapping a wired network containing nodes, which may be configured to identify themselves, determining node locations with respect to other nodes and generating an electrical wiring diagram.

BACKGROUND

When buildings are constructed, there may or may not be a detailed plan for the deployment of electrical fixtures in the design schematics. If one does exist, over the course of the construction, the plan may frequently change "on the fly" due to the changing needs of the customer or individual decisions by electricians—while the original plans remain unchanged. When an electrical installation job is complete, typically, an electrician may place a few words on a paper label on the inside cover of electrical service box, notating things like "stove," "refrigerator," "2nd floor bedroom" or perhaps "front offices," but knowing what devices (outlets, switches . . . etc.) are actually connected to a particular circuit or to each other, may remain a mystery—the answer is in a tangle of wires behind the walls or above the ceiling.

When there are problems with electrical service and/or if future work needs to be done within a building, a large amount of time may be invested to figure out how the building is wired. For example, trying to evaluate and diagnose safety problems may be difficult, since knowing how a circuit is laid out could be central to understanding and diagnosing the cause. Additionally, before any electrical rework is completed on a building, it may be important to know how existing devices are connected to one another and to which breakers/circuits they belong.

In addition to the above, with the increasing emphasis on energy costs and efficiency, the ability to properly monitor power usage within a house or building is becoming ever more important. Knowing what devices are connected to a particular circuit, and in fact, how they are connected to one another and physically located within a building may provide much more information about how and where energy is being used. Monitoring power usage and costs may provide building owners and/or occupants a better understanding of how to adjust their usage to reduce both their costs and the load on the power system.

SUMMARY

An aspect of the present disclosure relates to a system for determining the electrical connections of a plurality of nodes. The system may include an electrical power distribution system including a plurality of nodes, connected to the power distribution system. At least two of the nodes may include node electronics and at least one of the nodes may be configured to be operatively coupled to an external power drawing load. In addition, at least one of the nodes upstream from the node configured to be operatively coupled to the external power drawing load may be configured to detect power drawn by the external power drawing load and the at least one upstream node may be configured to send a node electrical signal using node electronics indicating that drawn power was detected. The system may be configured to identify the wiring configuration of the plurality of nodes relative to each other based on node electrical signal(s).

Another aspect of the present disclosure relates to a method for determining the electrical connections of a network of a plurality of nodes. The method may include operatively coupling an external power drawing load to one of a plurality of nodes on a conductive pathway, wherein the node is downstream from at least one upstream node of the plurality of nodes and the external power drawing load draws power from the conductive pathway. The method may also include detecting by the at least one upstream node that power has been drawn by the external power drawing load and identifying a wiring configuration of the nodes relative to other nodes based upon which upstream nodes detected the power drawn.

In a further aspect, the present disclosure relates to a node for mapping an electrical power distribution system. The node may include a conductive pathway, wherein the conductive pathway includes a hot conductor and a neutral conductor, a ground conductor, a sensor operatively coupled to the conductive pathway, a microcontroller, and a switchable load. The sensor may be configured to measure an imbalance of current passing through the conductive pathway. The microcontroller may be in communication with the sensor and a communications chip, and may be configured to send a node electrical signal through the conductive pathway by the communications chip. The switchable load may be configured to connect to the hot conductor and to the ground conductor and may be in communication with the microcontroller.

In another aspect, the present disclosure relates to a system for determining the electrical connections of a plurality of nodes. The system may include an electrical power distribution system including a conductive pathway, a ground conductor, and a plurality of nodes connected to the power distribution system. At least one node may be upstream from at least another node, which is downstream, and at least two of the nodes may include node electronics. The node electronics may be configured to draw current from the conductive pathway to the ground conductor. The upstream node may be configured to determine whether the downstream node has drawn current from the conductive pathway to the ground conductor and to send a node electrical signal using the node electronics indicating that the current draw was detected. The system may be configured to identify the wiring configuration of the plurality of nodes relative to each other based on node electrical signal(s).

A further aspect relates to a method for determining the electrical connections for a network of a plurality nodes. The method may include drawing by at least one downstream node current from a conductive pathway to a ground conductor, determining by at least one node upstream from the downstream node that current has been drawn from the conductive pathway, and identifying a wiring configuration of the nodes relative to other nodes based upon which upstream nodes identify the current drawn to the ground conductor.

BRIEF DESCRIPTION OF DRAWINGS

The features described herein, and the manner of attaining them, may become more apparent and better understood by reference to the following description of embodiments taken in conjunction with the accompanying drawings, wherein.

DETAILED DESCRIPTION

The present disclosure relates to a system and method for mapping a wired network containing nodes which may be configured to identify themselves to a central processor or identify themselves with respect to one other. The connection of the nodes may then be determined with respect to other nodes from which an electrical wiring configuration and/or wiring diagram may be generated. For example, a central processor (e.g., a computer), which may coordinate and collect node communications and information, may be connected or integrated into a breaker panel or any location within any given building, or even positioned at a remote location, or distributed between many locations. A visual display may be provided to analyze/review the electrical system, including the electrical wiring diagram, usage for given circuits or rooms, and/or usage for specific nodes. Furthermore, any aspect of the information regarding the electrical system may be forwarded to a remote location and accessed, e.g., over the Internet or any desired information network.

Figure 1:
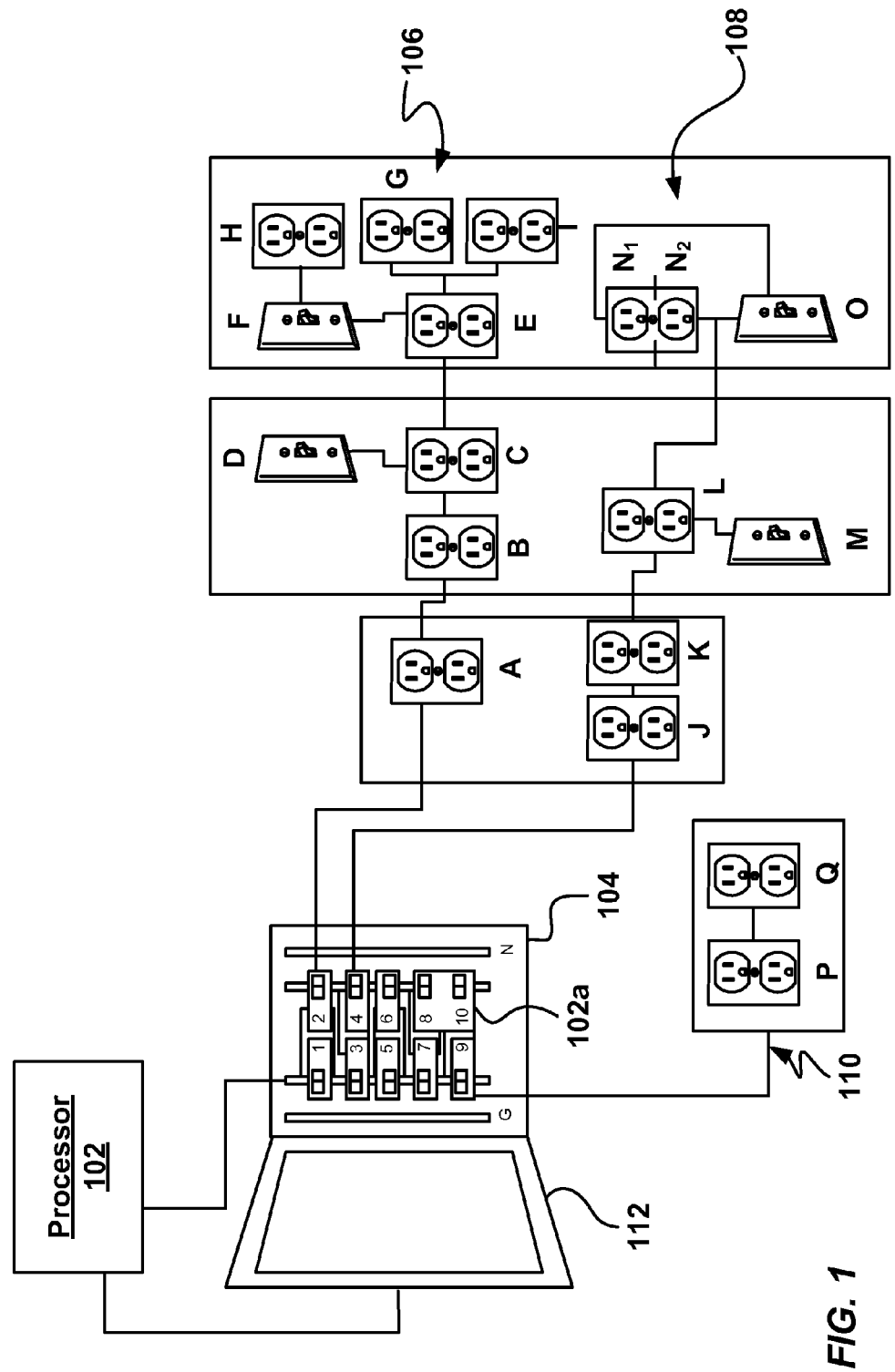
FIG. 1 is a schematic illustration of an exemplary system contemplated herein.

An overview of an example of the system architecture contemplated herein is illustrated in FIG. 1. The system may include a central processor 102, and/or include distributed processing capabilities, an electrical distribution system or power supply (e.g. as a breaker box 104) and a series of nodes A-Q located along three circuits 106, 108 and 110 connected to breaker nodes #2, #4 and #9 and other breaker nodes #1, #3, #5, #6 and #7. The nodes may include electronics configured to monitor power usage and other conditions within the nodes or in proximity to the nodes. In addition, the electronics may be configured to monitor signals (node electrical signals) sent between the nodes and/or the central processor 102. Node electrical signals may provide information, including identifying information, status information, etc. to the other nodes or central processor. The processor, or portions of its functions, may be remotely located and communicated via wireless techniques, phone, internet, power line or cable. The processor may also interface with the network at any of the node locations.

A processor as referred to herein may be any device or devices which may be configured to carry out one or more of the following: coordinate communication, control mapping events at the nodes, run algorithms to determine topology and analyze power, as well as provide external communication to other devices through means such as phone, ethernet, internet, cable, wireless, etc. The processor may communicate over the electrical distribution system, be integrated into the system or located remotely. In one example, a processor 102a may be positioned in a circuit breaker position within a breaker box (104) and may communicate to multiple phases simultaneously. In another embodiment, the functions of the processor are handled on a distributed basis by computational power and memory available at each node. In addition, the processor may utilize the node electrical signals to generate relative upstream and downstream ordering of the nodes and in turn generate a wiring diagram from such ordering.

"Nodes" may be understood herein as switches, outlets, breakers, connectors, junction boxes, lighting loads and any other hard wired devices or locations where connections may be made, and may include node electronics at these locations for communicating with the system and monitoring conditions. The term "node" may also be applied to devices which are plugged into a circuit if they are so enabled with a means for communicating with the system. The node may be associated with other nodes in a circuit or with a given location in a building. Furthermore, the node may provide additional functionality, such as providing power to an outlet under specific conditions, e.g. all prongs being inserted simultaneously into an outlet.

The nodes may be configured to receive external power drawings loads. External power drawing loads may include appliances or devices that may draw power through or proximal to a node. For example, when a node is an outlet, an external power drawing load, such as a toaster, may draw power from the outlet, wherein the prongs of the toaster may be inserted into an outlet receptacle. Similarly, where a node is a switch, an external power drawing load, such as a light, may draw power through the switch.

Furthermore, as noted above, the nodes may be configured to receive or send electrical signals. Initiation signals provided by the processor or another node may, for example, cause the node to identify itself, sending an indentifying signal to the processor or another node. The identifying node electrical signal may include unique identifier information, which may be specific to the node, such as a serial number or mac number/address. In addition, detecting or determining that current or power is being drawn past the node, whether it be through or around the node, may cause the node to send node electrical signals.

Referring back to FIG. 1, each of the three circuits 106, 108, 110 depicted may contain a variety of switches and outlets which may provide routing of power throughout a building, which may be configured to receive external power drawing loads. For example, breaker #2 provides power to outlets A, B, C, E, H, G and I, and also to switches D and F. It may be understood that electrical devices and loads within a building are electrically wired in one or more circuits. A circuit may be understood as a path for the flow of current. Circuits may also be wired in "parallel." When wired in "parallel," disconnecting one device will not prevent the others from working. However, it may be appreciated that some devices may be wired in "series," wherein the devices may be dependent on other devices to provide power through an electrical connection in the device itself. In other words, disconnecting an upstream device will disable downstream devices. For example, on breaker #2, power to outlets E, G, I, H and switch F in Room 4 may be dependent on outlets A, B and C, i.e. if any of these are disconnected, outlets E, G, I, H and switch F in Room 4 may not have power since each of outlets A, B and C use an electrical bus in their housings to provide power to the next outlet. However, outlets G and I are not dependent on one another and both may maintain power if the other is disconnected.

Furthermore, it may be appreciated that nodes, i.e., the outlets, switches, etc., may be connected to a common bus, or conductive pathway. As understood herein, a conductive pathway may be understood as a common electrical connection, such as a conductor, a printed circuit conductor, a busbar or a power line, providing electrical continuity between at least one connection on each of the nodes and at least one other connection. Furthermore, it may be appreciated that one or more additional conductive pathways may be provided for the nodes in a given system. A given conductive pathway may include a hot conductor, which may be understood as an electrically live or active conductor, and a neutral conductor, which may be understood as an electrically passive conductor.

Furthermore, a ground conductor may be provided in a system. The ground conductor may provide connection to a ground connection, such as earth. The ground conductor may substantially follow a conductive pathway. It may be appreciated that some deviations between the conductive pathway and ground conductor may be present in a given system. In some examples, a portion of the nodes may be in communication with the ground conductor and other nodes may not, where as all of the nodes may be in communication, either directly or indirectly, with the conductive pathway. The nodes, along the conductive pathway, may be upstream or downstream, relative to one another. Upstream nodes may be understood as nodes that may be wired electrically in the path of flowing current proximal to the source of power relative to other nodes, whereas downstream nodes may be understood as nodes that may be wired electrically in the path of flowing current distal from the source of power relative to other nodes. At any time, a given node may not be upstream of one or more nodes or may not be downstream of one or more nodes. For example for node E, nodes A, B, C and #2 (breaker) may be considered upstream nodes, and nodes F, G, H and I may be considered downstream nodes. Some nodes may share the same set of upstream and/or downstream nodes, because they are electrically equivalent, for example, in FIG. 1, nodes G and I.

In one embodiment, the nodes may be mapped relative to one another by end load mapping. That is, when an external power drawing device is operatively coupled to a node, and power is drawn by the external power drawing device by the node, that node, as well as the nodes upstream from that node along a given conductive pathway, may sense power being drawn from the external power drawing device. Operative coupling may be understood as, for example, providing a connection, such as an electrical and/or mechanical connection between the external power drawing device and a node. For example, when an external power drawing device, such as a toaster is plugged into an outlet, it may be understood to be operatively coupled to the node. In another example, when a light bulb is inserted into a socket, it may be understood as being operatively coupled. In a further example, when power is provided to an external device in an inductive manner, it may be understood to be operatively coupled. It may be appreciated that a number of other examples of operative coupling may be realized by a person having ordinary skill in the art.

Figure 2:
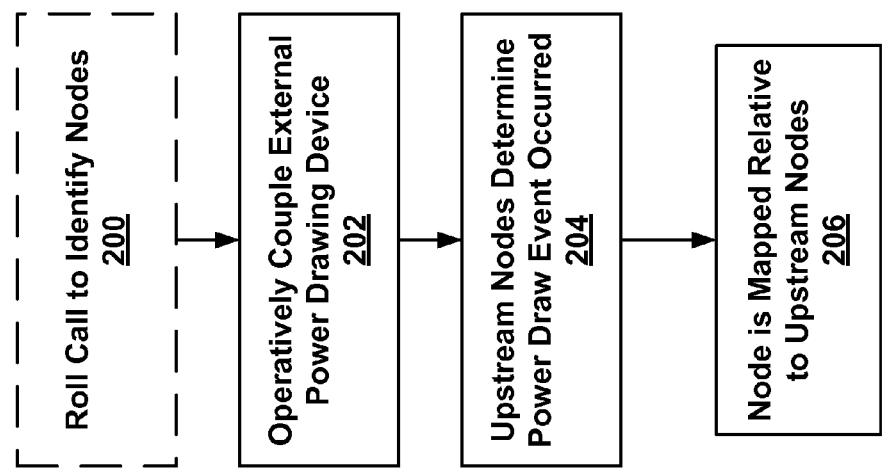
FIG. 2 is a flow diagram of an example of end-load mapping.

An example of mapping by this method is illustrated in FIG. 2. An external power drawing device may be operatively coupled to a node 202. The external power drawing device may draw power from the node to which it is plugged and through the conductive pathway. Nodes upstream from the node into which the external power drawing device is operatively coupled may sense the power draw 204 or determine that power has been drawn and the system may infer that the node to which the external power drawing device is operatively coupled is downstream relative to the upstream nodes 206 that sensed the power flow. As additional external power drawing devices draw power through additional nodes, the system may track where the nodes are relative to each other. In some examples, all of the nodes may be identified in an optional initial roll-call step 200, wherein an initialization signal may be sent to the node electronics, which may provide an identifying node electrical signal in response. In some examples, roll call may be initialized upon providing power to the system.

Figure 3:
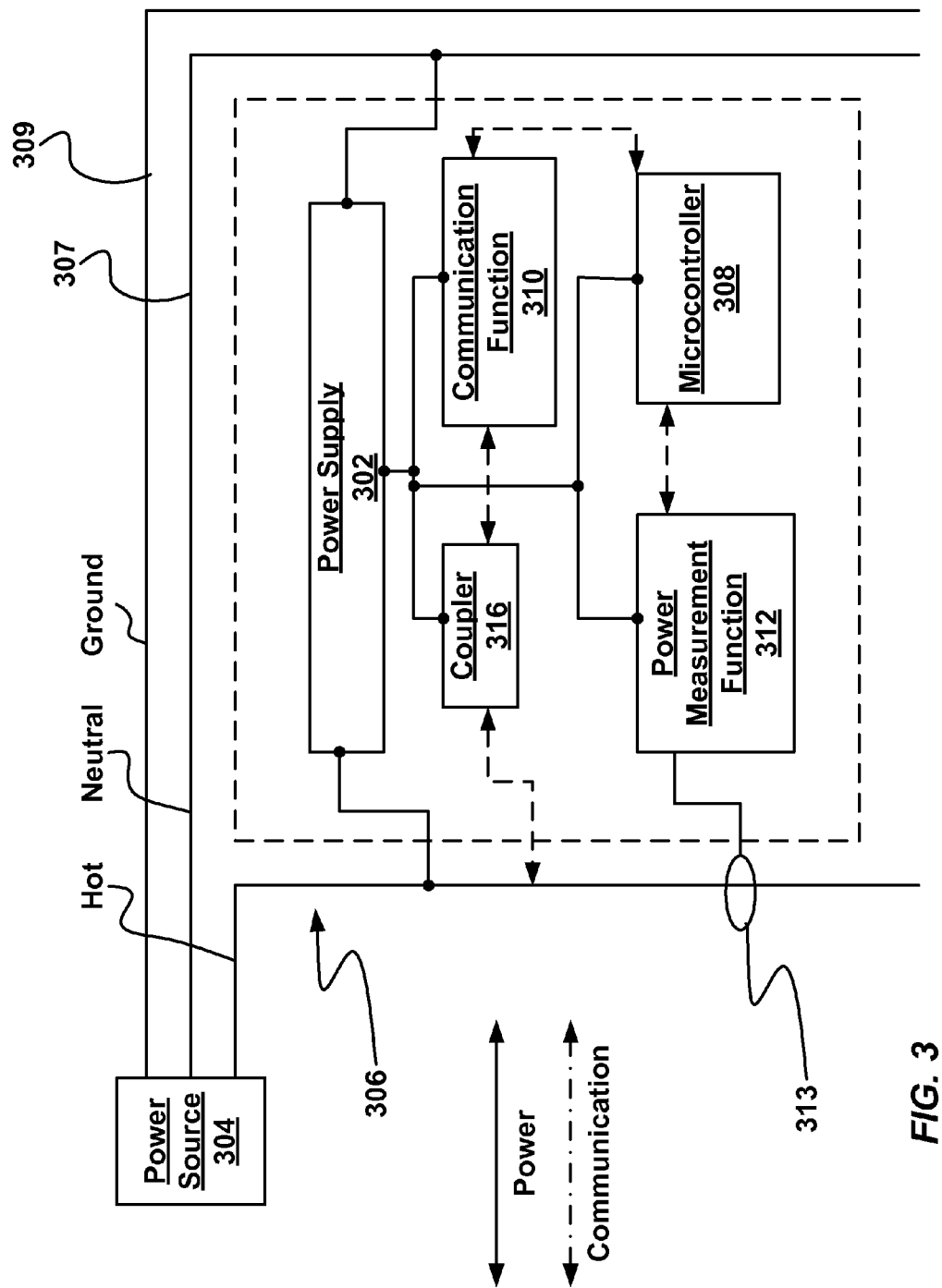
FIG. 3 is a schematic of an example of node electronics for end-load mapping.

The power draw may be sensed by the nodes using node electronics, which may also be utilized to provide signals to other nodes or to a central processor, to sense power usage by the node itself, as well as to perform other functions. FIG. 3 is a block diagram of an example of the electronics associated with a node, such as when mapping is performed by end load mapping. The unit may include or may consist of a power supply 302, a microcontroller 308, a communications function 310, a power measurement function 312, and a coupler 316, which enables communication to take place on the power lines.

The power supply may draw power from a power source 304 though power line 306 with a return path for the current, neutral line 307. A ground conductor 309 may optionally be present. The power supply may be a low voltage power supply (e.g., less than 30 volts), and may be configured to transform the power from AC to DC, and reduce the voltage to a level acceptable for the microcontroller and communication functions. In addition, the power supply may include a battery, which may be charged with energy available between line power 306 and neutral 307. A microcontroller is illustrated at 308 for controlling the actions of the unit based on logic inputs. The microcontroller may also include arithmetic elements, as well as volatile and/or non-volatile memory. In addition, the microcontroller may include identifier information for identifying the node, such as a serial number stored in the controller.

A communications function 310 may also be provided. The communication function may be provided on the micro-controller as input and output interfaces. The communication function may create and receive node electronic signals which may be interpreted by the various electronics within the node, other nodes or in a central processor with which the node may communicate. Signals received by the node may be filtered from and to the power line by a coupler 316. The coupler 316 may allow for one or more communication signals to be sent over the power line 306 and may utilize existing communication standards. The node may also utilize some form of wireless communications in order to communicate information to other nodes or to a central processor.

A power measurement function 312 which may measure key aspects of power (current, voltage, phase . . . etc.), may also be integrated into the micro-controller, or communicate therewith. The power measurement function may be facilitated by measuring the magnetic field generated by the current, and/or the voltage across the node. While it may be appreciated that power may not be measured directly, power may be determined by measurement of both current and voltage. Sensors 313 for performing these functions, e.g., measuring current, phase or voltage, may include Hall effect sensors, current transformers, Rogowski coils, or other devices. It may be appreciated that node electronics may include multiple power measurement functions.

Figure 4:
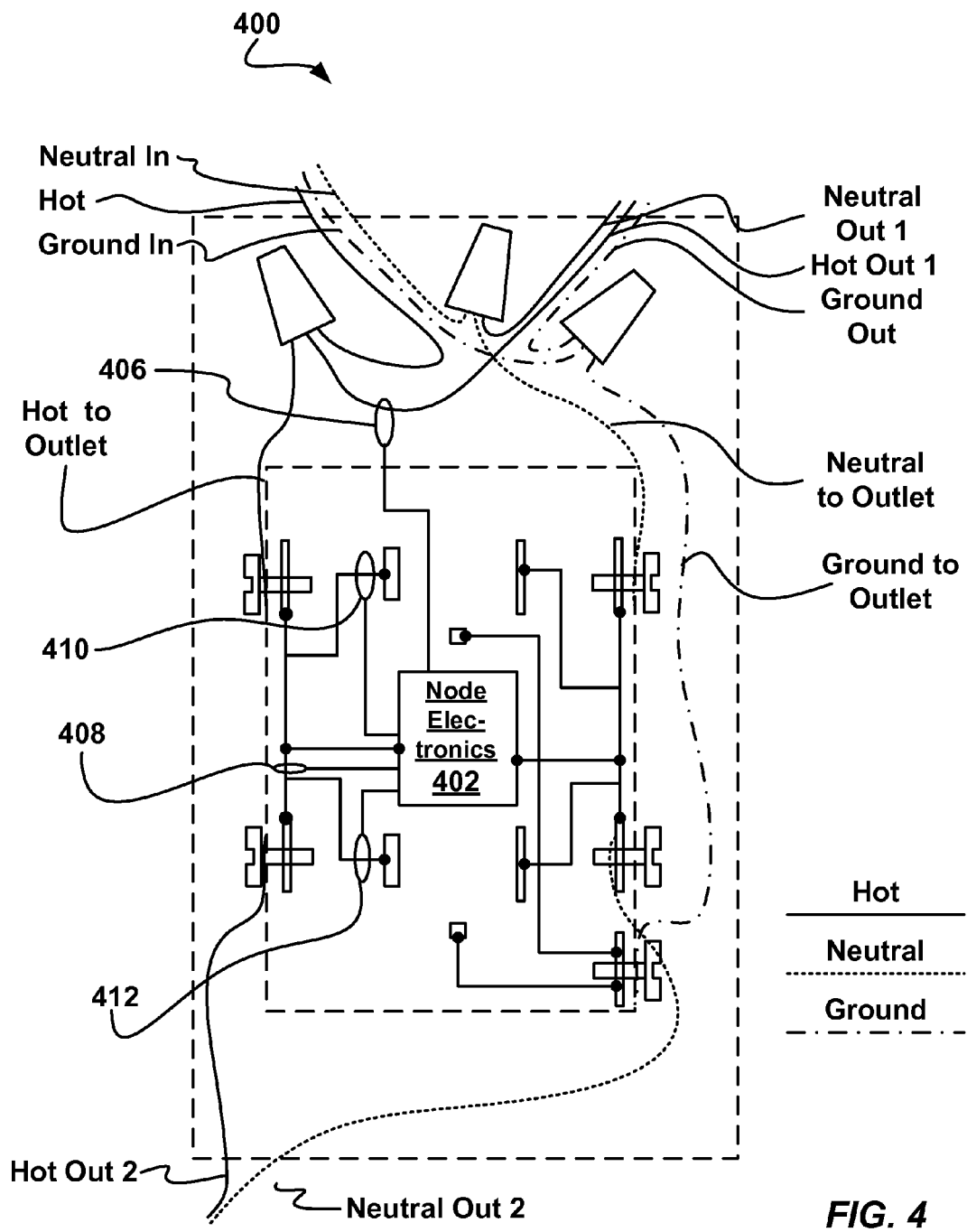
FIG. 4 is a schematic diagram of a duplex outlet receptacle and an example of node electronics for the receptacle for end-load mapping.

In addition, the node wiring and electronics may be configured based on the node type. For example, FIG. 4 is a diagram of an exemplary outlet node 400 (which represents a duplex socket) and associated wiring. The outlet may include power provided through a "hot wire" via the "Hot In" wire and to the individual sockets via wire "Hot to Outlet." Power may also pass into the outlet via "Hot Out 1" and "Hot Out 2." In addition, a neutral may be provided to the outlet "Neutral In" as well as through the outlet and out of the outlet, "Neutral Out 1" and "Neutral Out 2," respectively. Furthermore, a ground connection may be provided through a "ground wire" via the "Ground In" wire. The ground conductor may also pass through the outlet via "Ground Out". The electronics 402 may include a current sensor 408, which may enable measurement of the power flowing through the node, a feature which may enable mapping, and current sensors 410 and 412, which may measure power drawn from their respective sockets. In addition, external current sensor, 406, may be provided, which may allow the monitoring of power passing through the electrical box or by the electrical box that does not pass through the node itself. Accordingly, it may be appreciated that the current passing through the node, being drawn from the node and flowing around the node may all be measured. These sensors may allow for a better understanding of the physical location of nodes with respect to one another. In situations where the two sockets of a duplex receptacle are wired separately, a single set of node electronics may be used for both monitoring and mapping each receptacle independently.

Figure 5:
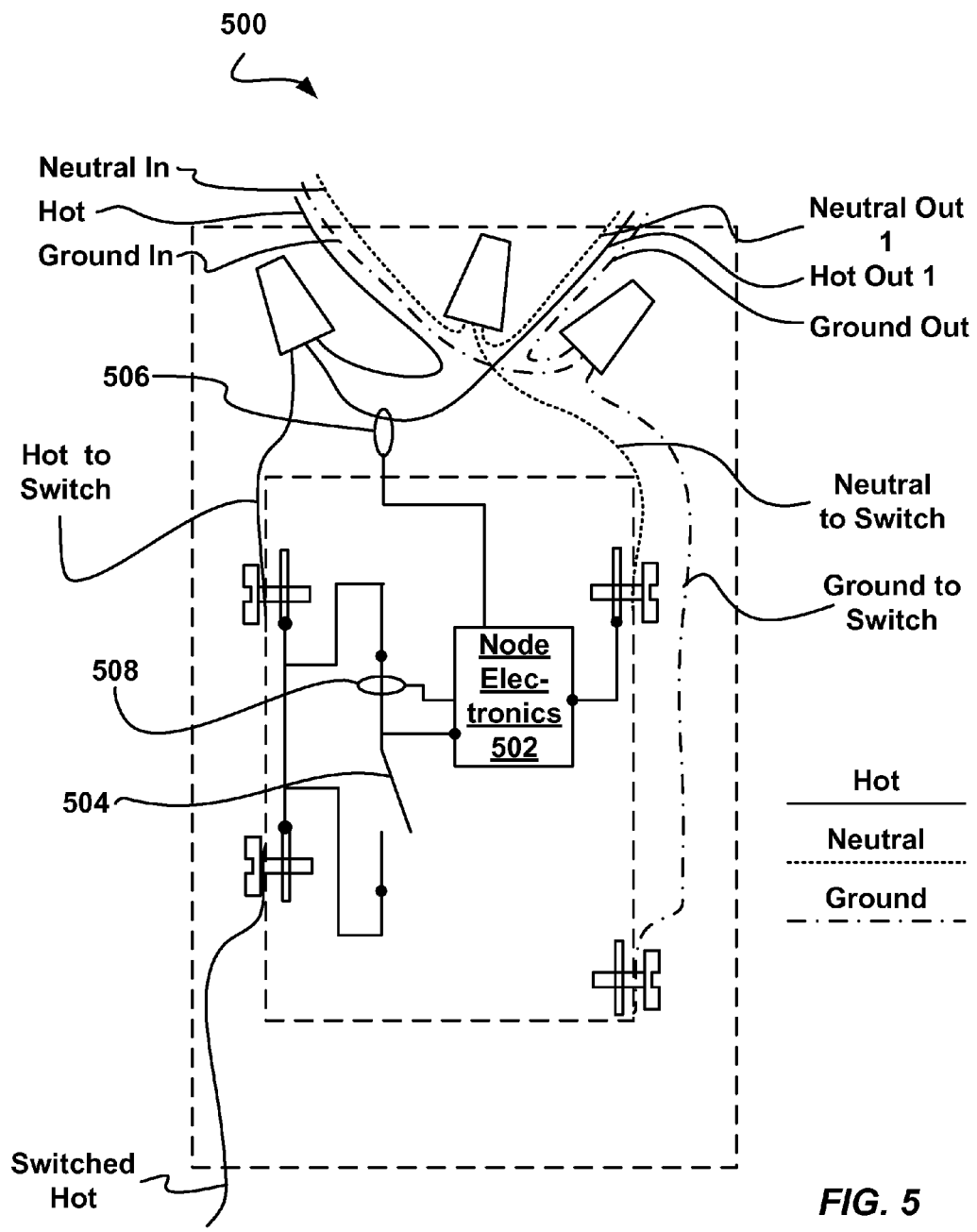
FIG. 5 is a schematic diagram of an example of node electronics in a two-way switch for end-load mapping.

FIG. 5 is a diagram of an exemplary 2-way switch node 500 and its associated wiring, i.e., "Hot In," "Hot Out," "Hot to Switch," "Switched Hot," as well as "Neutral In," "Neutral Out," "Neutral to Switch," "Ground In", etc. As seen, the electronics 502 may include a current sensor 508, which may enable measurement of the power drawn through the switch 504. The electronics may also include external sensors 506, which may monitor power which runs through the electrical box or by the electrical box, but not the node, allowing for a better understanding of the physical location of nodes with respect to one another. Note that the switch may include a neutral connection, which allows the system electronics to be powered for its various activities. Other schemes for drawing power without the neutral connection are contemplated. For example a current transformer may be used, which may pull power from a single wire when the switch is closed and under load. This power may be used to drive the node electronics and/or recharge a battery to power the node electronics for periods when power is not flowing. In addition, a small amount of power may be drawn from line voltage and returned to ground, in such a fashion and amount that it does not present any danger to people or property (and also so that any GFCI in the circuit does not unintentionally trip). This configuration may be used to charge a battery, which in turn may drive the electronics.

Figure 6:
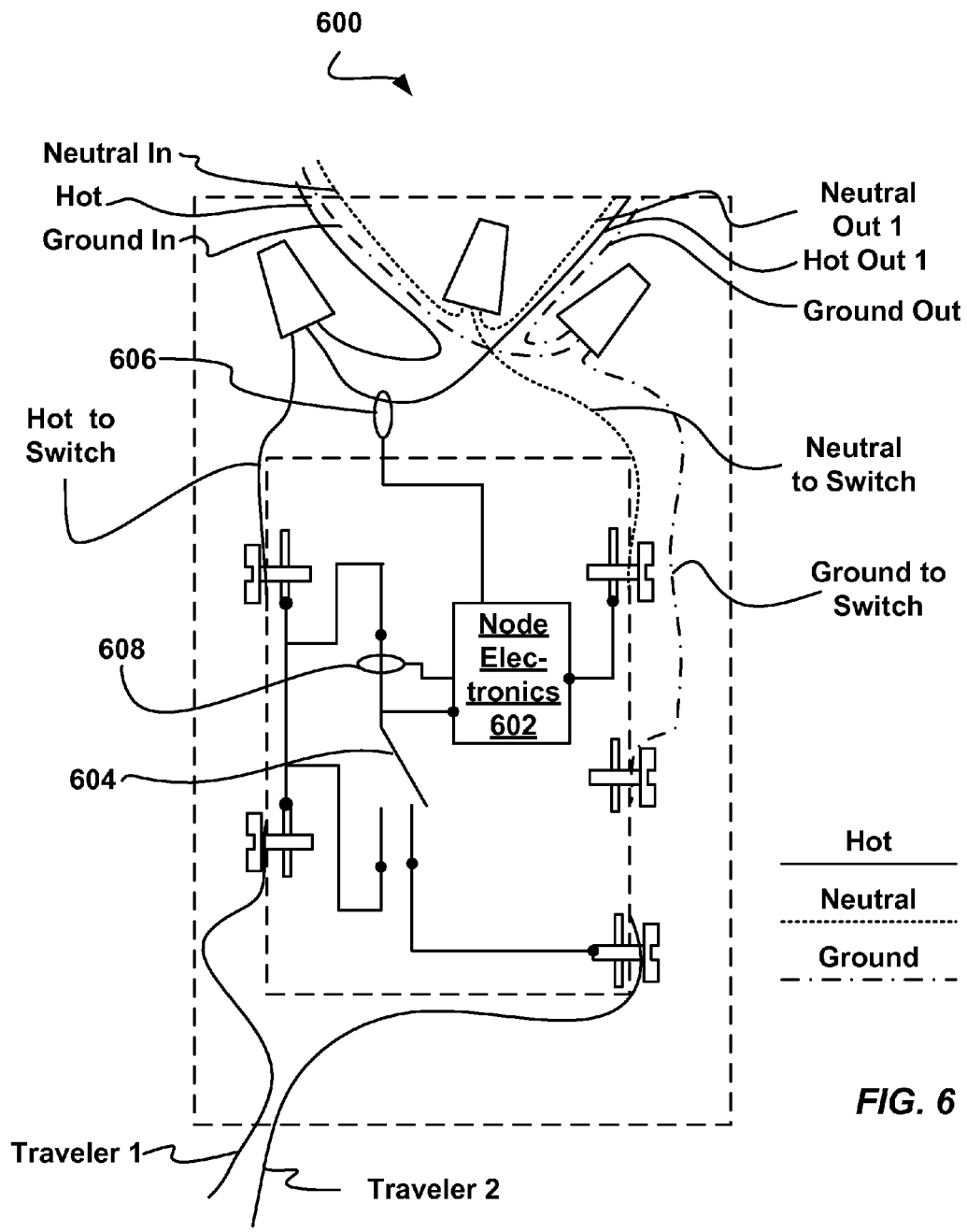
FIG. 6 is a schematic diagram of an example of node electronics in a three-way switch for end-load mapping.

FIG. 6 is a diagram of an exemplary 3-way switch 600, wherein some of the characteristics are consistent to those described with respect to FIG. 5. More specifically, the electronics 602 may include a current sensor 608, which may measure the power drawn from the switch. The electronics may also include external sensor 606 for monitoring power which runs through the electrical box or by the electrical box but not the node, allowing for a better understanding of the physical location of nodes with respect to one another. Once again, the switch may include a neutral connection, which may allow the system electronics to be powered for its various activities. Similar methods for powering a 2-way switch in the absence of a neutral may also be applied for a 3-way switch.

Figure 7:
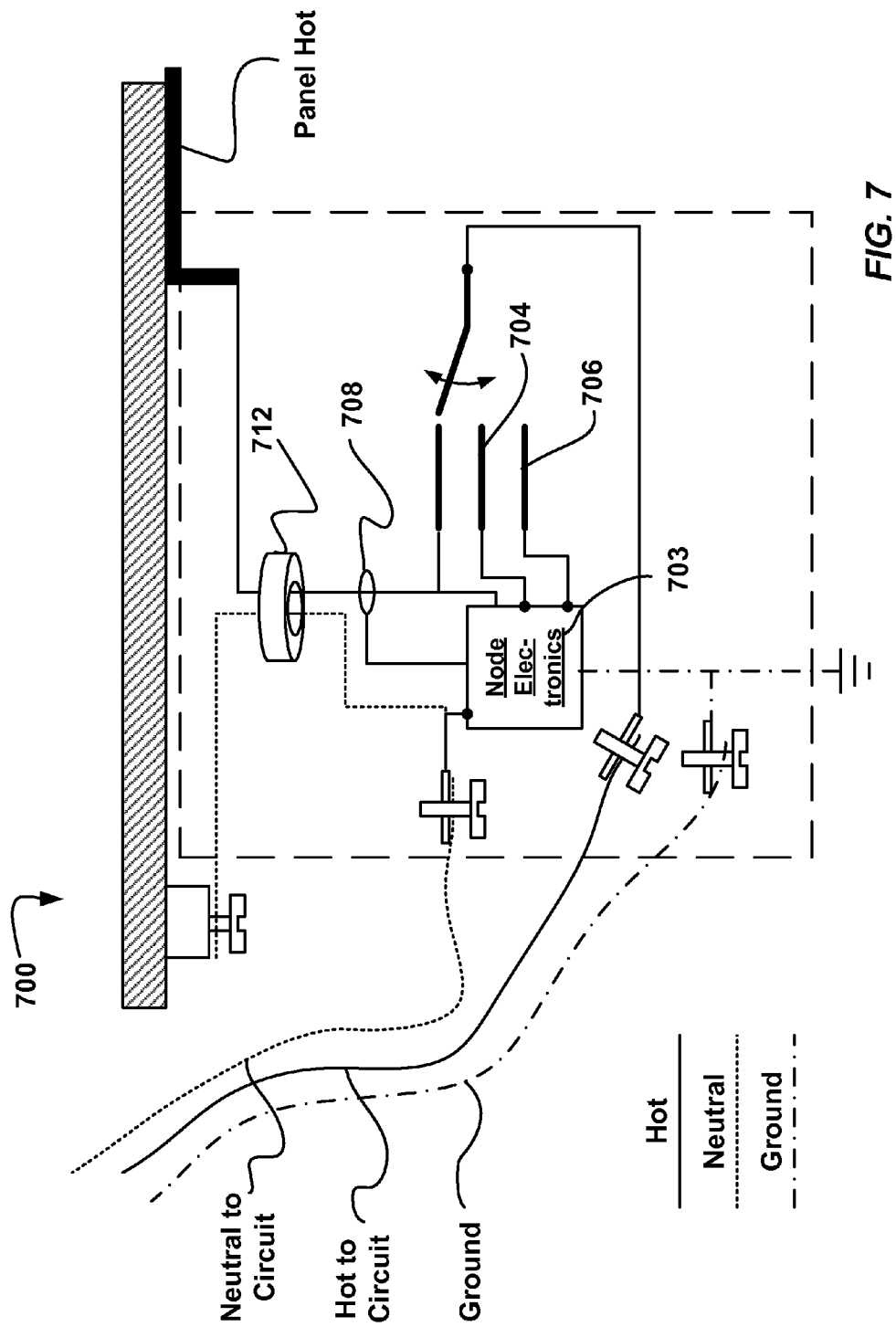
FIG. 7 is a schematic diagram of an example of node electronics for use in a breaker for end-load mapping.

FIG. 7 is a diagram of an exemplary circuit breaker including system electronics 703. The breaker may receive power from the circuit panel through a "hot" wire "Panel Hot." The breaker may provide power to a circuit through "Hot to Circuit" and "Neutral to Circuit." The breaker may include node electronics 703 like other nodes, including a sensor 708 to enable power measurement through the breaker. Like other breakers, it may have the ability to switch off in the case of an over-current, ground fault and/or arc-fault condition or other conditions which may be deemed unsafe. For example, the breaker may include a GFCI sensor and/or other electronics 712. However, when the breaker trips and removes power, it may continue to provide communication with its circuit and the rest of the system. The individual nodes on the circuit may be self-powered including batteries, capacitor or super-capacitor, etc., so that they may communicate information to the breaker during a fault condition. The circuit may then report to the breaker and then to the processor (central or distributed) what may have caused the fault and what actions should be taken before turning the circuit back on. Among many possibilities, these actions may include unplugging a load (appliance) or calling an electrician.

In one embodiment, the breaker may switch to a communications channel 704 where nodes, running on residual power (provided by a battery or capacitor, etc.) may communicate their status. In another exemplary embodiment, the breaker may connect to a power limited channel 706 (low voltage and/or current) to continue to provide small amounts of power to the circuit for communication. This power could be applied as a low voltage supply between line and neutral or a low voltage supply between line and ground, at a level that does not present a danger, and assuring the power draw does not cause any GFI in the circuit to trip. The breaker may be configured to enter either a communications or low power mode via a remote command to interrogate the system and identify problems. Alternatively, the nodes may be able to communicate important information about the events leading to a fault condition before the breaker trips.

In another embodiment, mapping may be performed by ground fault mapping. In ground fault mapping, current sensors, such as toriods, may be present to sense current imbalances between hot and neutral conduits in a conductive pathway. Micro-loads may be provided in the node electronics to drawn current or power to ground thereby creating an imbalance, which may then be sensed by the current sensors. The drawn power may be detected by nodes upstream from the activated node and the activated node may be mapped relative to the upstream nodes. Each node in a system may be activated individually or in a systematic manner to map the nodes relative to each other.

Figure 8:
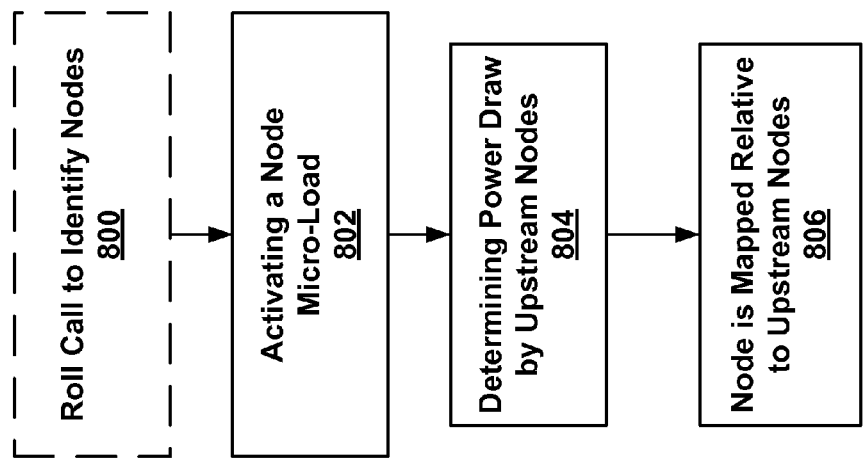
FIG. 8 is a flow diagram of an example of ground fault mapping.

For example, FIG. 8 illustrates a method of mapping by ground fault mapping. The method may begin by activating a micro-load in a given node 802. The micro-load may draw current from a conductive pathway to a ground conductor. Nodes upstream of the activated node may sense or determine that current has been diverted by the activated node 804. The activated node, which may be determined to be a downstream node, may thereby be mapped relative to the upstream nodes 806.

Ground fault mapping may optionally be initiated upon a roll-call 800, wherein a processor, or another node, may provide an initiation signal to one or more, or all, of the nodes. Upon initiation, the nodes may provide identification information and/or begin to periodically activate their micro-loads. Or, upon initiation, the nodes may provide identification information and then activate at random intervals, communicating the timing of said activations, mapping over a period of time. In other examples, ground fault mapping may occur on a random basis, without initiation by a central processor. It may be appreciated that the identification information may be provided as indentifying node electronic signals, which may be unique to the individual nodes.

Figure 9:
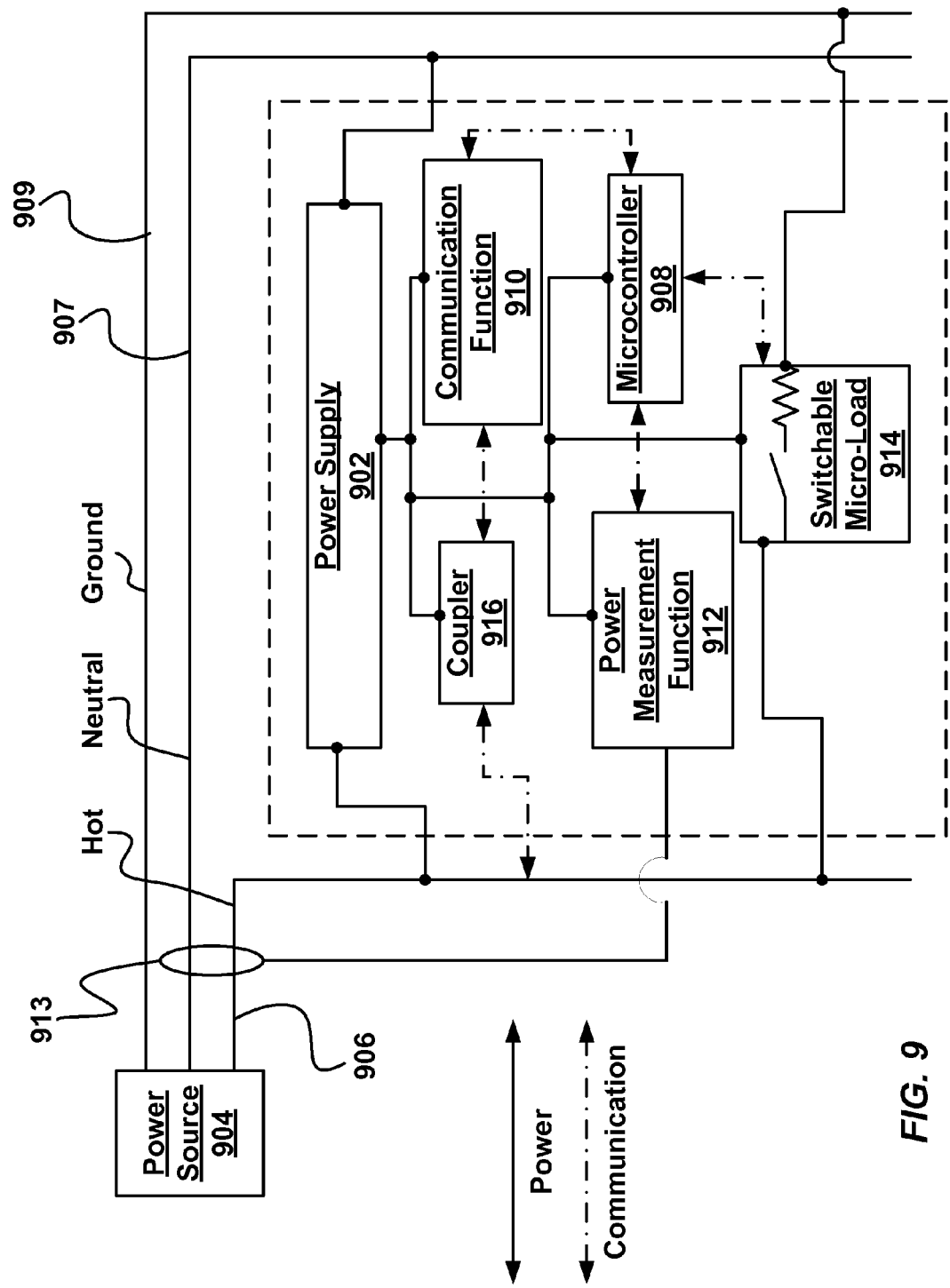
FIG. 9 is a schematic of an example of node electronics for ground fault mapping.

As alluded to above, the node electronics may include a micro-load, as illustrated in FIG. 9. Again, the node electronics may be utilized to provide signals to other nodes or to a central processor, sense current usage through the node, and other functions. FIG. 9 is a block diagram of an exemplary version of the electronics associated with a node. The unit may include a power supply 902, a microcontroller 908, a communications function 910, a power measurement function 912, a current sensor 913, a switchable micro-load 914 and a coupler 916, which enables communication to take place on the power lines.

The power supply may draw power from a power source 904 though power line 906 with a return path for the current, neutral line 907. The power supply may be a low voltage power supply (e.g., less than 30 volts), and may be configured to transform the power from AC to DC, and reduce the voltage to a level acceptable for the micro-controller, the switchable micro-load and communication functions. In addition, the power supply may include a battery, which may be charged with energy available between line power 906 and neutral 907. A micro-controller is illustrated at 908 for controlling the actions of the unit based on logic inputs. The micro-controller may also include arithmetic elements, as well as volatile and/or non-volatile memory. In addition, the micro-controller may include identifier information for identifying the node, such as a serial number stored in the controller.

A communications function 910 may also be provided. The communication function may be provided on the micro-controller as input and output interfaces. The communication function may create and receive node electronic signals which may be interpreted by the various electronics within the node, other nodes or in a central processor with which the node may communicate. Signals received by the node may be filtered from and to the power line by a coupler 916. The coupler 916 may allow for one or more communication signals to be sent over the power line 906 and may utilize existing communication standards.

A power measurement function 912 which may also measure key aspects of power (current, differences in current or current imbalances, voltage, phase . . . etc.), may also be integrated into the micro-controller, or communicate therewith. The power measurement function may be facilitated by measuring the magnetic field generated by the current through and/or the voltage across the node. While it may be appreciated that power may not be measured directly, power may be determined by measurements of both current and voltage. Sensors 913 for performing these functions, e.g., measuring current, phase or voltage, may include Hall effect sensors, current transformers, Rogowski coils, as well as other devices. Additional sensors may also be provided to measure current drawn from the node. One method of measurement may include measuring current imbalances. It may be appreciated that typically, current passing through the hot conductor may be the same, or relatively the same, as current passing through the neutral conductor. Current imbalances may occur where current is different between the hot and neutral conductors, when different there may be a loss or imbalance in the system.

A switchable "micro-load" 914 may also be included. The switchable "micro-load" may draw power from the power line to a ground conductor 909 when the micro-load is activated. The micro-load may be activated when directed by the microcontroller, such as during mapping or other system functions. The powered micro-controller may direct the switchable micro-load to trigger, diverting current to the ground connection.

Figure 10:
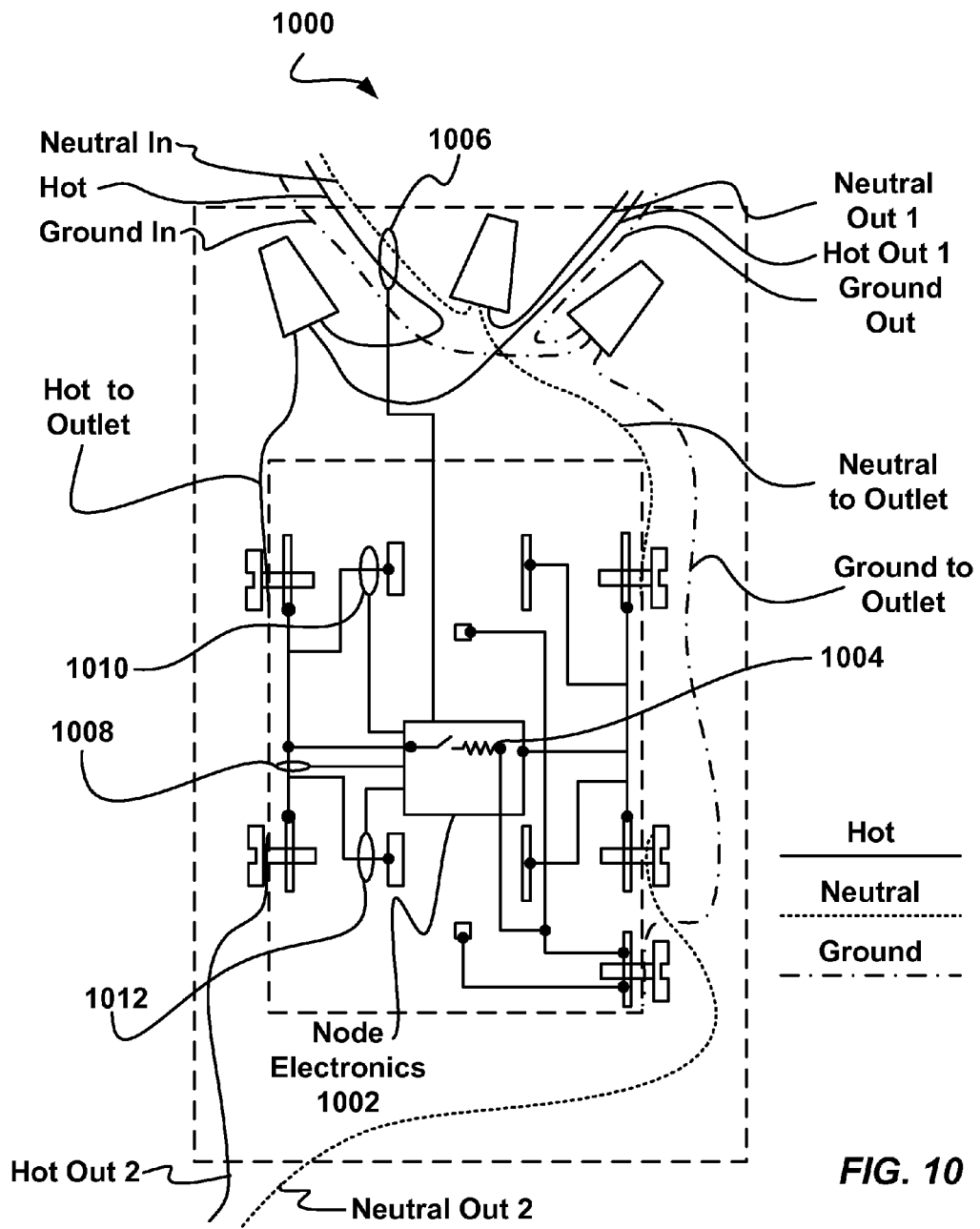
FIG. 10 is a schematic diagram of a duplex outlet receptacle and an example of node electronics for the receptacle for ground fault mapping.

Again, the node wiring and electronics may be configured based on the node type. For example, FIG. 10 is a diagram of an exemplary outlet node 1000 (which represents a duplex socket) and associated wiring. The outlet may include power provided through a "hot wire" via the "Hot In" wire and to the individual sockets via wire "Hot to Outlet." Power may also pass through the outlet via "Hot Out 1" and "Hot Out 2." In addition, a neutral may be provided to the outlet "Neutral In" as well as through the outlet and out of the outlet, "Neutral Out 1" and "Neutral Out 2," respectively. Furthermore, a ground conduit may be provided to the outlet "Ground In" as well as through the outlet "Ground Out". The electronics 1002 may include a switchable micro-load 1004. Current sensor 1008 may enable measurement of the current flowing through the node, and current sensors 1010 and 1012, may enable measurement of current drawn from their respective sockets. In addition, external current sensor 1006 may be provided, which may monitor current passing through the electrical box or by the electrical box that does not pass through the node itself. As illustrated the external current sensor 1006 may be provided outside or external to the node itself and may, therefore be tethered to the node. Accordingly, it may be appreciated that the current passing through the node, being drawn from the node and flowing around the node may all be measured. These sensors may allow for a better understanding of the physical location of nodes with respect to one another. In situations where the two sockets of a duplex receptacle are wired separately, a single set of node electronics may be used for both monitoring and mapping each receptacle independently.

Figure 11:
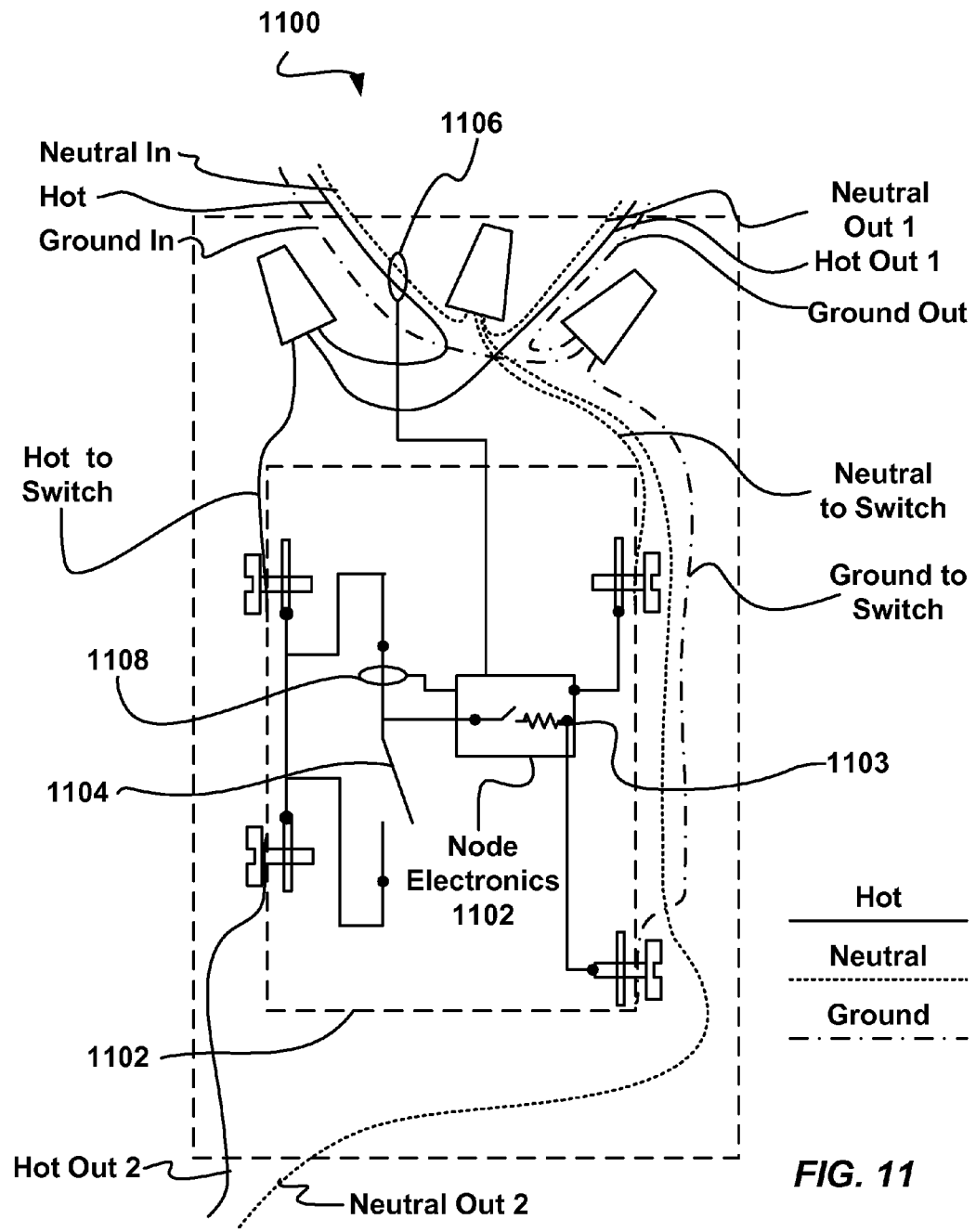
FIG. 11 is a schematic diagram of an example of node electronics in a two-way switch for ground fault mapping.

FIG. 11 is a diagram of an exemplary 2-way switch node 1100 and its associated wiring, i.e., "Hot In," "Hot Out," "Hot to Switch," "Switched Hot," as well as "Neutral In," "Neutral Out," "Neutral to Switch," "Ground In", "Ground Out" etc. As seen, the electronics 1102 may include a switchable micro-load 1103 for the switch 1104, wherein the switchable micro-load may connect to ground. Current sensor 1108 may enable measurement of the current drawn through the switch. The electronics may also include external sensor 1106, which may monitor current which runs through the electrical box or by the electrical box, but not through the node, allowing for a better understanding of the physical location of nodes with respect to one another. Note that the switch may include a neutral connection, which allows the system electronics to be powered for its various activities.

Figure 12:
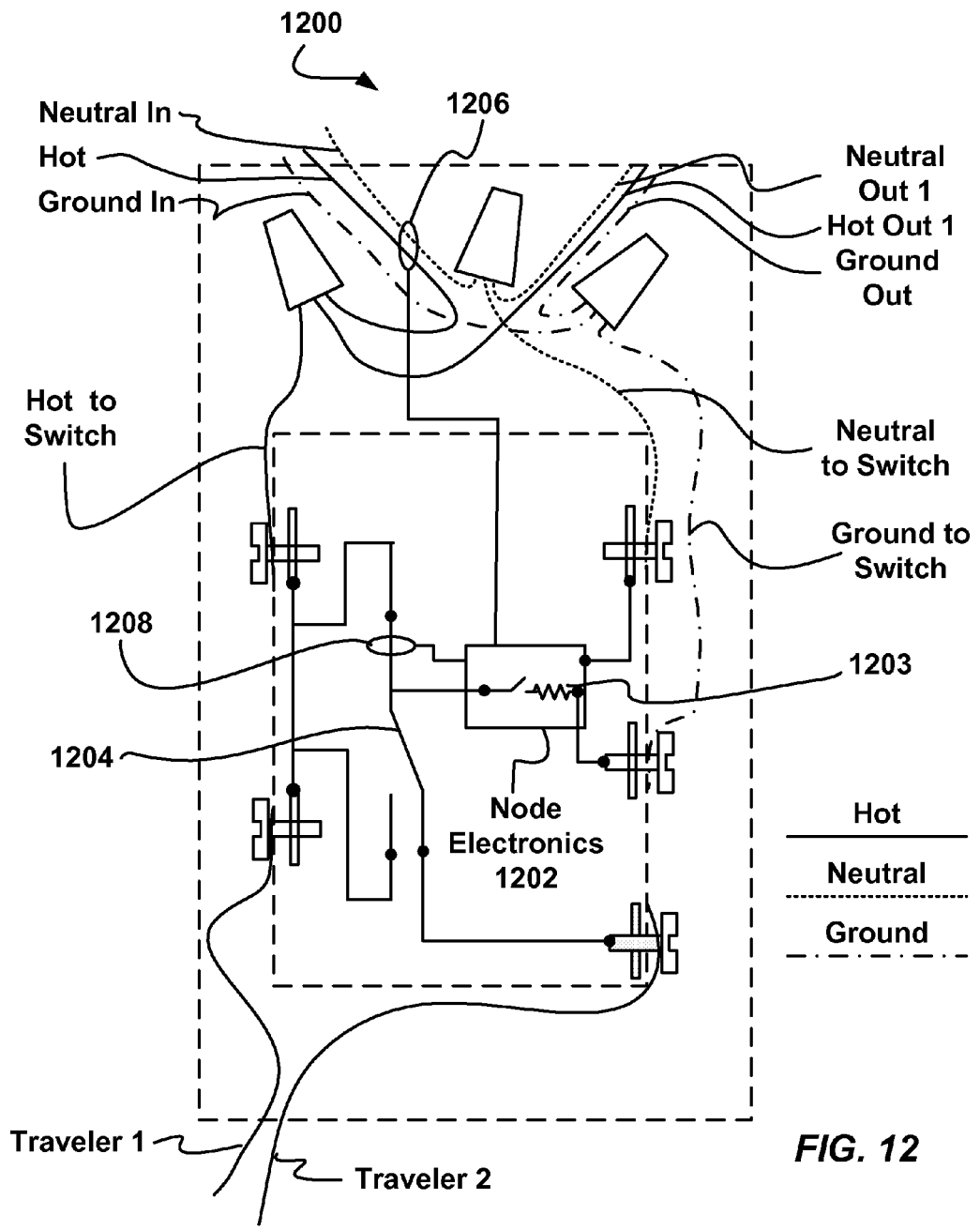
FIG. 12 is a schematic diagram of an example of node electronics in a three-way switch for ground fault mapping.

FIG. 12 is a diagram of an exemplary 3-way switch, wherein some of the characteristics are consistent to those described with respect to FIG. 11. More specifically, the electronics 1202 may include a switchable micro-load 1203 for the switch 1204, wherein the switchable micro-load may be in communication with ground. Current sensor 1208 may measure the current drawn from the switch. The electronics may also include external sensor 1206 for monitoring current which runs through the electrical box or by the electrical box but not through the node, allowing for a better understanding of the physical location of nodes with respect to one another. Once again, the switch may include a neutral connection, which may allow the system electronics to be powered for its various activities. Similar methods for powering a 2-way switch in the absence of a neutral may also be applied for a 3-way switch.

Figure 13:
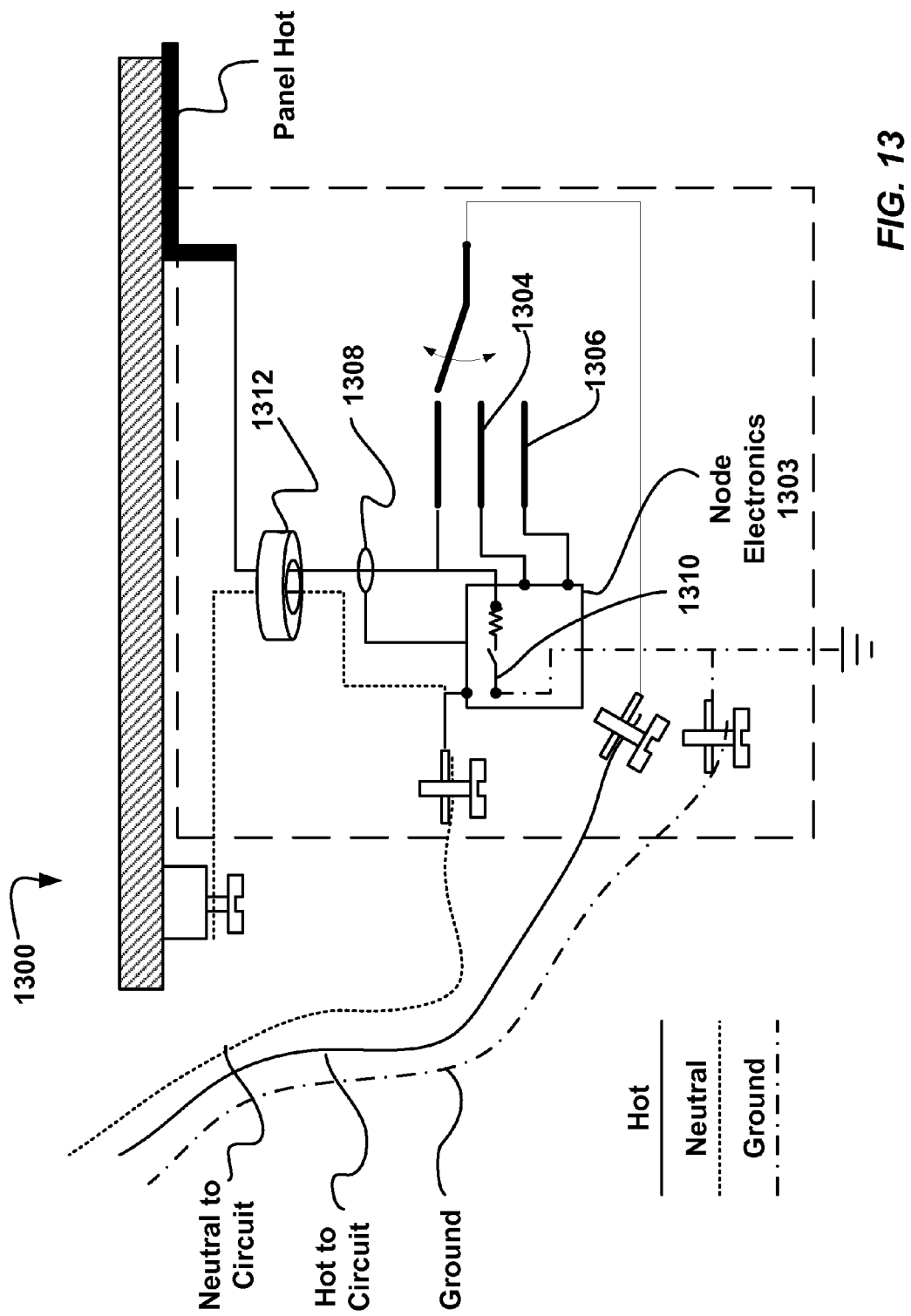
FIG. 13 is a schematic diagram of an example of node electronics for use in a breaker for ground fault mapping.

FIG. 13 is a diagram of an exemplary circuit breaker 1300 including system electronics 1303. The breaker may receive power from the circuit panel through a "hot" wire "Panel Hot." The breaker may provide power to a circuit "Hot to Circuit" and a neutral "Neutral to Circuit" as well as a ground connection "Ground Conduit". Like other nodes, the breaker may apply a switchable load 1310 which may allow the breaker to be identified in the network, wherein the switchable micro-load may draw current to the ground connection. The circuit breaker node may also include a sensor 1308 to enable power measurement through the breaker. Like other breakers, it may have the ability to switch off in the case of an over-current, ground fault and/or arc-fault condition or other conditions which may be deemed unsafe. For example, the breaker may include a GFCI sensor and/or other electronics 1312, allowing for ground fault mapping relative to the breaker as a node. However, when the breaker trips and removes power, it may continue to provide communication with its circuit and the rest of the system. The individual nodes on the circuit may be self-powered including batteries, capacitor or super-capacitor, etc., so that they may communicate information to the breaker during a fault condition. The circuit may then report to the breaker and then to the processor (central or distributed) what may have caused the fault and what actions should be taken before turning the circuit back on. Among many possibilities, these actions may include unplugging a load (appliance) or calling an electrician.

In one embodiment, the breaker may switch to a communications channel 1304 where nodes, running on residual power (provided by a battery or capacitor, etc.) may communicate their status. In another exemplary embodiment, the breaker may connect to a power limited channel 1306 (low voltage and/or current) to continue to provide small amounts of power to the circuit for communication. This power could be applied as a low voltage supply between line and neutral or a low voltage supply between line and ground, at a level that does not present a danger, and assuring the power draw does not cause any GFI in the circuit to trip. The breaker may be configured to enter either a communications or low power mode via a remote command to interrogate the system and identify problems. Alternatively, the nodes may be able to communicate important information about the events leading to a fault condition before the breaker trips.

Figure 14:
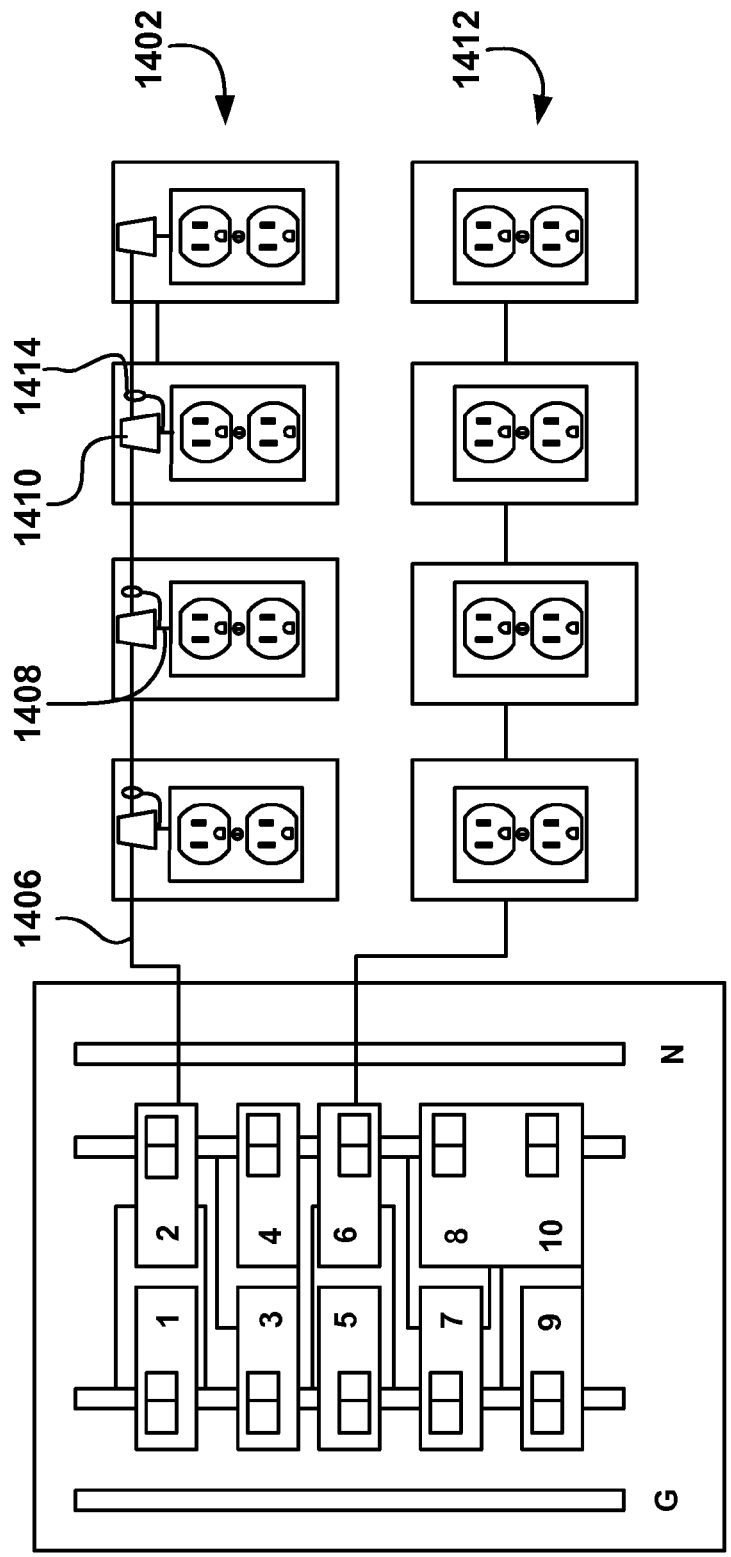
FIG. 14 is a schematic diagram of nodes wired in "parallel" versus nodes wired in "series."

It may be appreciated that in the embodiments above, the nodes may be wired in "pig-tail" or in "through" configuration. FIG. 14 shows the difference between what is termed a "pig-tail" (or parallel) configuration 1402, and a "through" or series configuration 1412. In a "pig-tail" configuration power may be brought into an electrical or junction box A-D from a main line 1406 and a short wire 1408 may be connected to the incoming wire and the outgoing wire (through twist on wire connector 1410, for example) to power a nodes A-D. This means that if any outlet/node is disconnected, power may continue to be provided to other nodes. This may be in contrast to through wiring 1412, where a conductive pathway within node J may be responsible for powering subsequent nodes K, L and M, (i.e. disconnecting power to node J will remove power from nodes K, L and M). In the pigtail configuration, external sensors (e.g. 1414) may be employed, which may indicate that A was wired before B, which was before C, which was before D. It should therefore be understood herein that node A is considered to be electrically upstream of, for example nodes B, C and D. For outlets J through M, the current sensor within the node may determine the order of the outlets relative to one another. Electrical junction boxes may also be configured with suitable electronics, so the monitoring and mapping information may be done by the box, which would then effectively be a node. In either configuration, i.e., "pigtail" or "through" configuration, the sensors may encompass a conductive pathway including both a neutral conductor and a hot conductor.

The foregoing description has been presented for purposes of illustration. It is not intended to be exhaustive or to limit the disclosure to the precise steps and/or forms disclosed, and obviously many modifications and variations are possible in light of the above teaching.

What is claimed is:

1. A system for determining the electrical connections of a plurality of nodes coupled to a circuit, comprising:
   an electrical power distribution system including
   a circuit;
   a processor coupled to said circuit;
   a plurality of nodes connected to said circuit and in communication with said processor, wherein at least a first node of said plurality of nodes and a second node of said plurality of nodes include node electronics, and said node electronics are configured to receive and send node electrical signals;
   an external power drawing load coupled to said first node, wherein said external power drawing load draws power from said circuit and through said first node,
   wherein said node electronics in said first node are configured 1) to detect said power drawn by said external power drawing load and 2) to send a node electrical signal from said first node to said processor by said circuit, indicating that said first node has sensed said power drawn by said external power drawing load,
   and said node electronics in said second node are configured 1) to detect power drawn through said second node and 2) to send a node electrical signal from said second node to said processor by said circuit, indicating said power drawn through said second node; and
   wherein said processor is configured to identify which of said plurality of nodes are upstream or downstream relative to one another on said circuit based on said node electrical signal sent from said first node and said node electrical signal sent from said second node, wherein if said second node is upstream from said first node said power drawn through said second node includes said power drawn by said external power drawing load.

2. The system of claim 1, wherein said first node electronics further includes a sensor for detecting said power drawn by said external power drawing load.

3. The system of claim 1, wherein said processor is configured to initiate a roll call and said plurality of nodes are configured to provide identifying signals to said processor.

4. The system of claim 3, wherein said processor is configured to initiate said roll call upon providing power to said processor.

5. The system of claim 1, wherein detecting said power drawn by said external power drawing load or said power drawn through said second node includes detecting changes in said power drawn.

6. A method for determining the electrical connections of a network of a plurality of nodes on a circuit, wherein said plurality of nodes includes a first node and a second node, comprising:

operatively coupling an external power drawing load to said first node on said circuit, wherein a processor is coupled to said circuit and said first node includes first node electronics and said second node includes second node electronics and said first and second node electronics are configured to receive and send node electrical signals;

drawing power by said external power drawing load from said circuit through said first node;

detecting said power drawn by said external power drawing load by said first node electronics and detecting power drawn through said second node by said second node electronics;

sending a first node electrical signal to said processor by said first node indicating that said first node has sensed said power drawn by said external power drawing load and a second node electrical signal to said processor by said second node indicating said power drawn through said second node; and identifying with said processor whether said first node is downstream from said second node on said circuit based upon said first node electrical signal and said second node electrical signal.

7. The method of claim 6, wherein said external power drawing load is an appliance or device to which power is being provided for operation.

8. The method of claim 6, further comprising initiating a roll call, whereupon said plurality of nodes each send an identifying signal to said processor.

9. The method of claim 8, wherein said roll call is initiated by said processor upon providing power to said processor.

10. The method of claim 6, further comprising operatively coupling said external power drawing load to all of said nodes on said circuit.

11. The method of claim 6, wherein detecting said power drawn by said external power drawing load or said power drawn through said second node includes detecting changes in said power drawn.

12. The method of claim 6, further comprising operatively coupling an additional external power drawing load to a third node of said plurality of nodes, wherein said third node includes third node electronics and wherein said external power drawing load draws additional power from said third node and said circuit; detecting said additional power drawn by said additional external power drawing load by said third node electronics; and identifying with said processor which of said first, second and third nodes are upstream or downstream relative to each other on said circuit based upon which of said first, second and third nodes detected said additional power drawn.

13. The method of claim 6, further comprising operatively coupling an additional external power drawing load to said second node, wherein said additional external power drawing load draws additional power from said second node and said circuit; detecting said additional power drawn by said additional external power drawing load by said second node electronics; and identifying with said processor whether said second node is upstream or downstream from said first node on said circuit.

\* \* \* \* \*